United States Patent
Zhang et al.

(10) Patent No.: US 8,069,432 B2
(45) Date of Patent: Nov. 29, 2011

(54) METHOD AND SYSTEM FOR PERFORMING STATISTICAL LEAKAGE CHARACTERIZATION, ANALYSIS, AND MODELING

(75) Inventors: Lizheng Zhang, San Jose, CA (US);
Hongliang Chang, San Jose, CA (US);
Kai-Ti Huang, Cupertino, CA (US);
Vassilios Gerousis, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 513 days.

(21) Appl. No.: 12/241,519

(22) Filed: Sep. 30, 2008

(65) Prior Publication Data

US 2010/0083198 A1  Apr. 1, 2010

(51) Int. Cl.
*G06F 17/50* (2006.01)
(52) U.S. Cl. .......................... 716/136; 716/106; 716/111
(58) Field of Classification Search .................. 716/106, 716/111, 136
See application file for complete search history.

(56) References Cited

U.S. PATENT DOCUMENTS

| | | | |
|---|---|---|---|
| 6,449,753 B1 | 9/2002 | Aingaran et al. | |
| 6,499,131 B1 | 12/2002 | Savithri et al. | |
| 6,940,293 B2 | 9/2005 | Ramarao et al. | |
| 7,137,080 B2 | 11/2006 | Acar et al. | |
| 7,363,605 B1 | 4/2008 | Kondratyev et al. | |
| 7,458,041 B2 | 11/2008 | Hershenson et al. | |
| 7,650,580 B2 | 1/2010 | Kucukcakar et al. | |
| 7,673,260 B2 | 3/2010 | Chen et al. | |
| 7,739,098 B2 | 6/2010 | Kucukcakar et al. | |
| 7,793,239 B2 | 9/2010 | Engel et al. | |
| 7,801,718 B2 | 9/2010 | Reddy et al. | |
| 2005/0172250 A1 | 8/2005 | Kucukcakar et al. | |
| 2006/0015834 A1 | 1/2006 | Amekawa | |
| 2006/0112359 A1 | 5/2006 | Becer et al. | |
| 2008/0046848 A1 | 2/2008 | Tetelbaum et al. | |
| 2010/0083198 A1 | 4/2010 | Zhang et al. | |

OTHER PUBLICATIONS

S. Mukhopadhyay, et al.. Modeling and estimation of total leakage current in nano-scaled CMOS devices considering the effect of parameter variation. International Symposium on Low Power Electronics and Design. Seoul, Korea, pp. 172-175, 2003.
S. Narendra, et al. Full-chip sub-threshold leakage power prediction model for sub-0.18μm CMOS. In Proceedings of the International Symposium on Low Power Electronics and Design. Monterey, California, pp. 19-23, 2002.
R. Rao, et al. Parametric yield estimation considering leakage variability. In Proceedings of Design Automation Conderence. San Diego, California, pp. 442-447, 2004.
A. Srivastava, et al. Modeling and analysis of leakage power considering within-die process variations. In Proceedings of the International Symposium on Low Power Electronics and Design. Monterey, California, pp. 64-67, 2005.
H. Chang, et al. Full-chip analysis of leakage power under process variations, including spatial correlations. In Proceedings of the ACM/IEEE Design Automation Conference. Anaheim, California, pp. 523-528, 2005.
A. Srivastava, et al. Accurate and efficient gate-level parametric yield estimation considering correlated variations in leakage power and performance. In Proceedings of Design Automation Conference. Anaheim, California, pp. 535-540, 2005.

(Continued)

*Primary Examiner* — Sun Lin
(74) *Attorney, Agent, or Firm* — Vista IP Law Group, LLP (57) ABSTRACT

A method, system, and computer program product are disclosed for performing statistical leakage power characterization to estimate yield of a circuit in terms of leakage power. According to some approaches, this is performed with consideration of bi-exponential modeling.

22 Claims, 6 Drawing Sheets

OTHER PUBLICATIONS

X. Li, et al. Projection-based statistical analysis of full-chip leakage power with non-log-normal distributions. Proceedings of the 43rd annual conference on Design automation, San Francisco, California, pp. 103-108, (Jun. 2007).

H. F. Dadgour, et al. Statistical Framework for Estimation of Full-Chip Leakage-Power Distribution Under Parameter Variations. IEEE Transactions on Electron Devices, Nov. 2007, vol. 52, Issue 11, pp. 2930-2945.

T. Li, et al. Statistical Analysis of Full-Chip Leakage Power Considering Junction Tunneling Leakage. DAC 2007, pp. 99-102.

Non-Final Office Action dated Sep. 17, 2010 for U.S. Appl. No. 12/143,547.

Non-Final Office Action dated Apr. 26, 2011 for U.S. Appl. No. 12/241,278.

Final Office Action dated Mar. 30, 2011 for U.S. Appl. No. 12/143,547.

Notice of Allowance dated Aug. 4, 2011 for U.S. Appl. No. 12/143,547.

Notice of Allowance dated Aug. 29, 2011 for U.S. Appl. No. 12/241,278.

| | $r_1$ | $r_2$ | $\cdots$ | $r_N$ | | $r_1$ | $r_2$ | $\cdots$ | $r_N$ |
|---|---|---|---|---|---|---|---|---|---|
| $s_1$ | $b_1^1$ | $b_2^1$ | $\cdots$ | $b_N^1$ | | $c_1^1$ | $c_2^1$ | $\cdots$ | $c_N^1$ |
| $s_2$ | $b_1^2$ | $b_2^2$ | $\cdots$ | $b_N^2$ | | $c_1^2$ | $c_2^2$ | $\cdots$ | $c_N^2$ |
| $\vdots$ | $\vdots$ | $\vdots$ | $\ddots$ | $\vdots$ | | $\vdots$ | $\vdots$ | $\ddots$ | $\vdots$ |
| $s_S$ | $b_1^S$ | $b_2^S$ | $\cdots$ | $b_N^S$ | | $c_1^S$ | $c_2^S$ | $\cdots$ | $c_N^S$ |

Figure 6

METHOD AND SYSTEM FOR PERFORMING STATISTICAL LEAKAGE CHARACTERIZATION, ANALYSIS, AND MODELING

BACKGROUND AND SUMMARY

The invention is directed to an improved approach for designing, analyzing, and manufacturing integrated circuits.

An integrated circuit (IC) has a large number of electronic components, such as transistors, logic gates, diodes, wires, etc., that are fabricated by forming layers of different materials and of different geometric shapes on various regions of a silicon wafer. Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. After an integrated circuit designer has created the physical design of the circuit, the integrated circuit designer then verifies and optimizes the design using a set of EDA testing and analysis tools.

Based upon the layout, photomasks are created for lithographic manufacturing of the electronic product. A photomask, or more simply a "mask," provides the master image of one layer of a given integrated chip's physical geometries. A typical photolithography system projects UV light energy on to and through the mask in order to transmit the mask pattern in reduced size to the wafer surface, where it interacts with a photosensitive coating on the wafer. Other processes may also be performed during to manufacture an integrated circuit. For example, etching, electroplated copper deposition (ECD), and chemical mechanical polishing (CMP) may be used to form interconnects for the IC.

Significant variations may arise during the process of manufacturing the IC. These variations are commonly caused by side-effects of the processing used to manufacture the IC. For example, optical effects of using lithographic manufacturing process may cause variations to exist in the manufactured device from the originally intended feature dimensions and geometries of the layout. Variations in feature density, widths, and heights may also occur during the CMP, etching, and plating processes.

With shrinking process node sizes, the inherent effect of process variations is playing a larger factor in defining the behavior of a circuit. In particular, the variations may lead to serious problems and flaws in the manufactured IC. This leads to serious risks of reduced manufacturing yield and increased failures for final products that incorporate the IC devices.

One particular area of concern is with regard to the management of leakage power in an IC product. As processing technology sizes shrink, the effects of process variations becomes quite significant towards its effects upon leakage power. Pattern-based effects within the manufactured IC devices may cause leakage currents in transistors to exceed allowable levels, which cause excessive amounts of leakage power to affect the performance and viability of the IC device.

The present application provides an improved approach to perform leakage power analysis, characterization, and management. Embodiments of the present invention are directed to statistical leakage analysis approaches for performing power estimation that can address leakage variation, cell modeling and/or full chip computation techniques. Some embodiments of the invention utilize a bi-exponential model to perform leakage analysis and power estimation. As leakage power variation continue to increase in nanometer technologies, the statistical approach of the present embodiments provide a significantly improved solution to performing leakage analysis.

Other and additional objects, features, and advantages of the invention are described in the detailed description, figures, and claims.

DETAILED DESCRIPTION

The present invention provides a method, system, and computer program product for performing statistical leakage power analysis with consideration of bi-exponential modeling. As used herein, the meaning of the terms "analysis" or "analyze" include characterization. As noted above, with shrinking process node sizes, the inherent effect of process variations is playing a larger factor in defining the behavior of a circuit. The present invention provides an improved approach for a method for estimating yield of a circuit in terms of leakage power which accounts for the sensitivity of the circuit design to process variations. According to some embodiments, bi-exponential modeling is employed to provide a more accurate set of cell models.

As noted above, as leakage power variations continue to increase in prevalence for modern designs, e.g., for designs based upon nanometer technologies, statistical full-chip leakage analysis technique becomes an important part of performing power estimation. To address leakage variation, cell modeling and full chip computation techniques are considered during the process of performing power analysis.

One possible approach to performing statistical leakage analysis is to employ simple exponential modeling for each process parameter and leakage component. However, using this type of simplistic models can result in severe error for the analysis. This is because the total cell leakage variation may come from different components such as gate leakage and sub-threshold leakage, even for the same process parameter variation. These different components may follow different types of exponential model and so that the summation of them will severely deviate from the simple exponential model.

In addition, leakage components for a LVT (low voltage threshold) design portion have different effects than similar component in a HVT (high voltage threshold) design portion. This is because, for example, some components may correspond to non-linearity in HVT, while in LVT they can be modeled as simple exponential. With such non-linearity, a quadratic-exponential model for cell parameter leakage may not be suitable. Such a non-linear model may involve complicated quadratic components for exponents, and therefore the computational cost could prevent this approach from being used for large industrial circuits. Nonlinearity may be addressed by grouping similar leakage functions together. However, grouping similar leakage functions together is likely to fail or be unsuitable due to too much ambiguity in the grouping criteria.

Another problem to be addressed is the problem of combining cell leakage sensitivities for different process parameters. An assumption can be made that this combined cell leakage sensitivity form is already given by a library or which simply puts individual parameter sensitivities together. However, a comprehensive solution for full-chip leakage power variation analysis cannot realistically avoid this problem. Using a simple collector approach can result in significant error, since these sensitivities are often significant enough in reality such that they are not small perturbations to the static leakage power.

Yet another problem comes from the input-state dependency of the cell leakage power. The average sensitivity form for the cell instances can be computed using switching probabilities obtained from static power estimation. However, there could be many states for a cell, and each cell could have many purely random variations. Since the average of these states is executed for each cell instances, the library may need to keep all sensitivities for random variations to prevent losing correlations and accuracy, causing possible excess consumption of resources because of the resultant library size.

Embodiments of the present invention provide an improved approach that addresses these and other problems. The present approach provides a statistical leakage power analysis engine that can address leakage analysis for dual Vt devices and remove many of the above limitations.

Embodiments of the invention model leakage by introducing a bi-exponential modeling and calculation. This model can be used to maintain the computational simplicity inherited from the simple exponential model. Also, by adding only the corresponding exponential parts between different bi-exponential forms, the groupings will naturally occur without any external criteria enforced artificially. In addition, embodiments of the invention provide a new mechanism that is able to combine the different parameter sensitivities. Yet another advantage of embodiments of the invention is that multiple variation types can be addressed. For example, embodiments can consider at least types of variation classes that include global variation, local systematic variation (spatial variation), and random variation (mismatch). A size-saving approach is employed to treat the random variations in a compact-size file while maintaining the necessary correlations between different input states.

Figure 1:
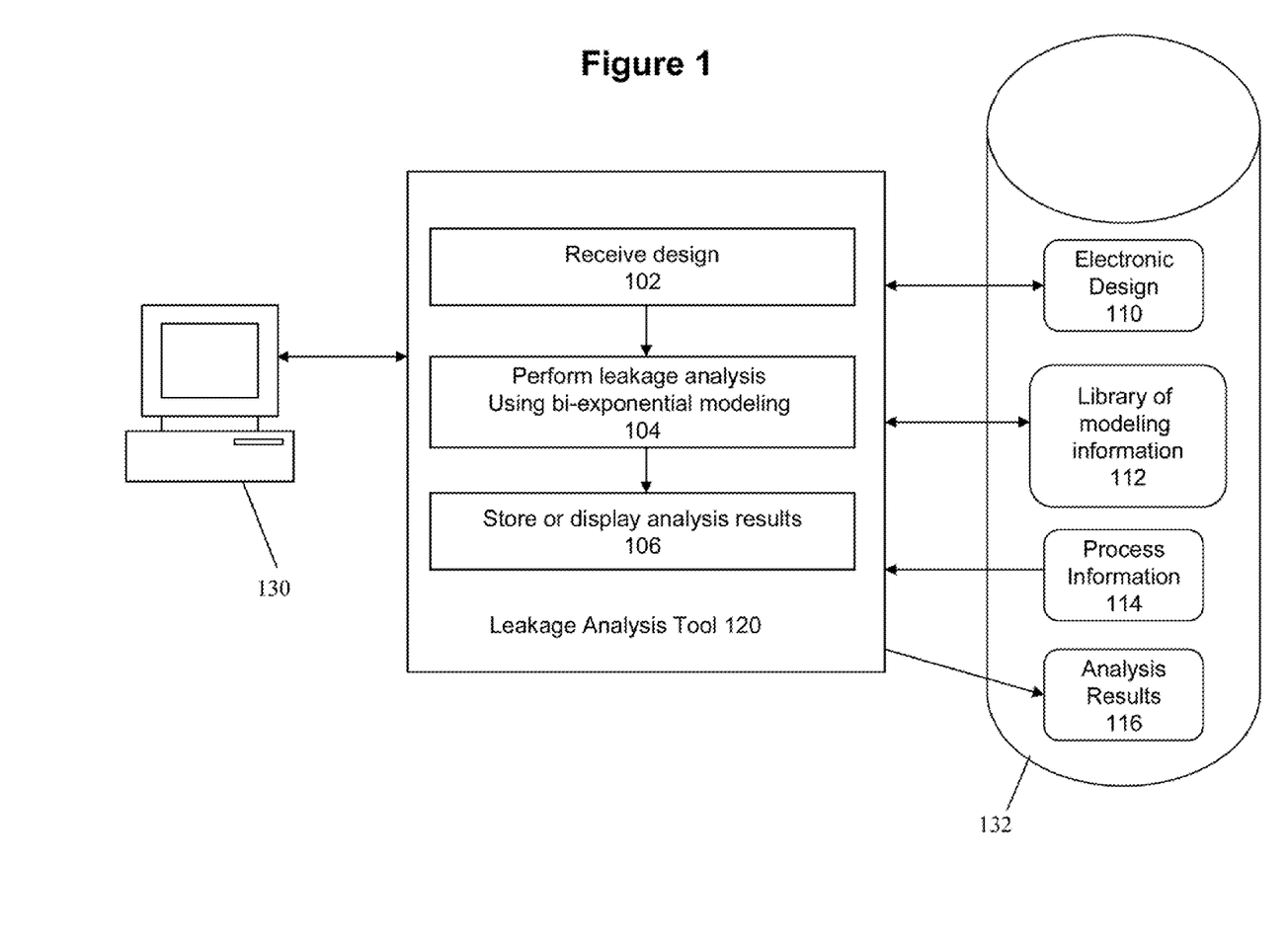
FIG. 1 shows an architecture of a system for performing leakage power analysis/characterization according to some embodiments of the invention.

FIG. 1 illustrates a high level architectural diagram of an example system with which the invention may be implemented. A user at a user station 130 utilizes an electronic design/analysis tool, e.g., a leakage analysis design tool 120, to analyze, characterize, optimize, and manage leakage power for an electronic design 110. The electronic design 110 may be stored in an electronic database 132. Process information 114 from the foundry may also be stored within the database 132.

The database 132 may also include a library 112 having one or more cell models. As used herein, the term "model" refers to a set of data that identifies one or more specific characteristics within an IC design, layout, and/or data relating to its effect, manufacturability, and/or usability. The cell models in the library 112 are generated by characterization of the cell behavior in various conditions. Therefore, the leakage library models in the library encapsulate the effects of process variations on leakage power. According to one embodiment, existing cell models for leakage can be enhanced to represent the effect of process variations on leakage. In a particular embodiment, these models represent the effect of process variations on leakage in terms of sensitivities based upon bi-exponential modeling. The analysis tools would use these sensitivity numbers to compute the effect of process variations on the overall design.

In operation, the leakage analysis tool 120 receives the electronic design 110 and process information 114 to perform an analysis of the leakage power situation (102). In some embodiments of the invention, leakage analysis/characterization is performed with consideration of bi-exponential modeling, as described in more detail below (104). Here, an accurate bi-exponential model is presented to represent the leakage power dependency on the process parameters. As described in more detail below, the effects from multiple process parameters are combined and considered to analyze the entire circuit or larger portions within the circuit. Based upon the results of the leakage power analysis/characterization, the results 116 can be either, or both, stored within a computer readable medium at the database 132 or displayed at a display device at user station 130.

Figure 2:
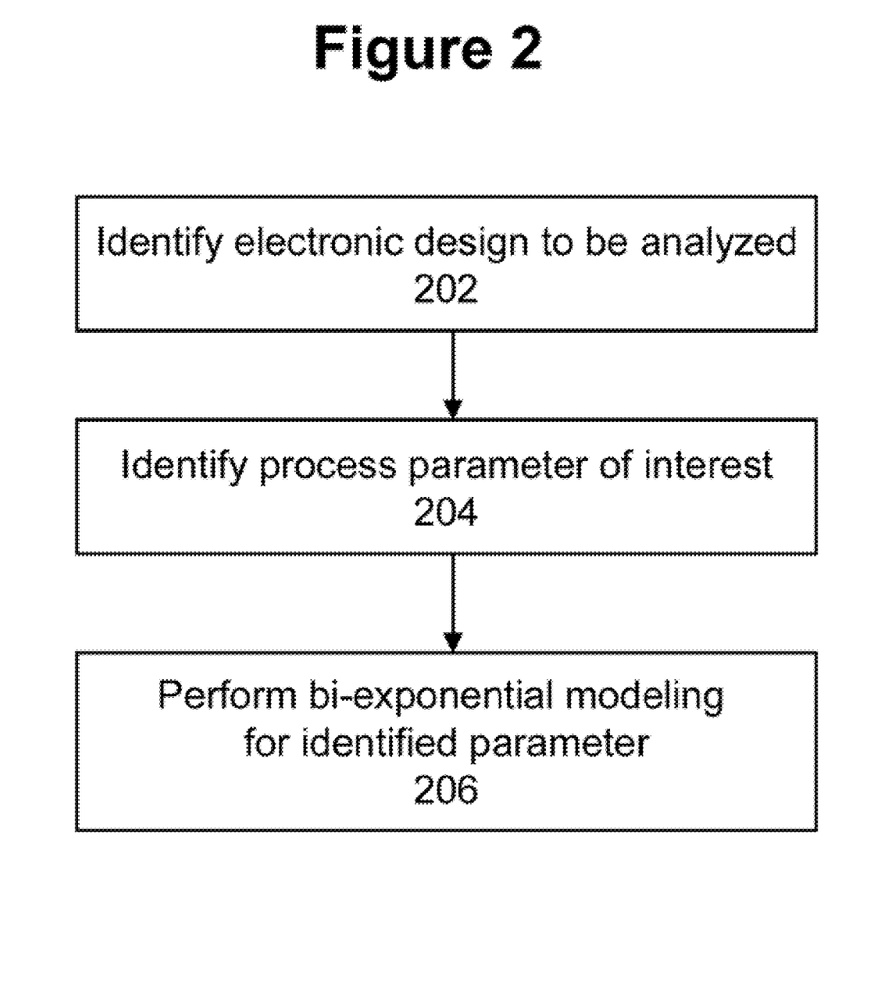
FIG. 2 illustrates a flowchart of a process for performing leakage power analysis/characterization with consideration of bi-exponential modeling according to some embodiments of the invention.

FIG. 2 shows a high-level flow of a process for performing leakage power analysis/characterization with consideration of bi-exponential modeling according to some embodiments of the invention. At 202, the process begins by identifying the electronic design to be analyzed. Any suitable type of electronic design can be analyzed and at different levels of design abstraction.

At 204, identification is performed of the specific process parameter of interest that is to be the subject of analysis. The identified parameter could be any parameter that may change or be varied based upon processing at the foundry/fabrication facility. Such process parameters include, for example, Channel length (L), Channel width (W), Oxide thickness (Tox) and Threshold Voltage (Vth). The process parameters may be identified and provided by the foundry or fab.

Next, at 206, bi-exponential modeling is performed to analyze characterize the leakage power with respect to the identified process parameter. To explain this approach, it is helpful to first consider the uni-exponential approach. The exponential model can express the leakage power P as a uni-exponential function of the Gaussian process parameter variation $\Delta X \sim N(0,1)$ as represented by the following equation:

$$P = P_0 \exp(b \cdot \Delta X) \quad (1)$$

where $P_0$ is the nominal leakage power when there is no process variation and b is the sensitivity for the variation $\Delta X$.

If there are two leakage power values $P^+$ and $P^-$ which are measured when $\Delta X = \pm 3$, the b value can be computed in the least square sense using the following equation:

$$b = \frac{1}{6}\log\frac{P^+}{P^-} \quad (2)$$

Such a uni-exponential model implies that the logarithm of the leakage power will change linearly when the process parameter varies. The problem is that while there are some circumstances under which linearity applies, there are also many other circumstances where non-linearity is significant.

Therefore, a bi-exponential model is used to characterize the leakage power in a cell. This provides an exponential form that correctly captures the fast changing rate of the leakage current when process parameter varies, and in additional also provides a good solution to the above non-linearity problem. The following represented one approach for implementing a bi-exponential model:

$$P = 0.5P_0[\exp(b \cdot \Delta X) + \exp(c \cdot \Delta X)] \quad (3)$$

where b and c are two sensitivity constants. Using the same measurement values $P^+$ and $P^-$ as used in equation (2), the b and c constants can be computed as follows:

$$b, c = \frac{1}{3}\log\left(0.5u \pm 0.5\sqrt{u^2 - 4v}\right) \quad (4)$$

where $u = 2P^+/P_0$ and $v = P^+/P^-$, b takes + and c takes −.

If $P^+P^- \geq P_0^2$, then there will be a real solution to b and c. But if $P^+P^- < P_0^2$, which is likely to be rare but may happen occasionally, then it is assumed that b=c and the bi-exponential model will reduce to a uni-exponential model.

Therefore, this process provides a very efficient and accurate approach for performing leakage analysis for a single given process parameter. In typical circuit designs, it is quite likely that there will be multiple process parameter variations that affect the cell leakage power uncertainty.

Figure 3:
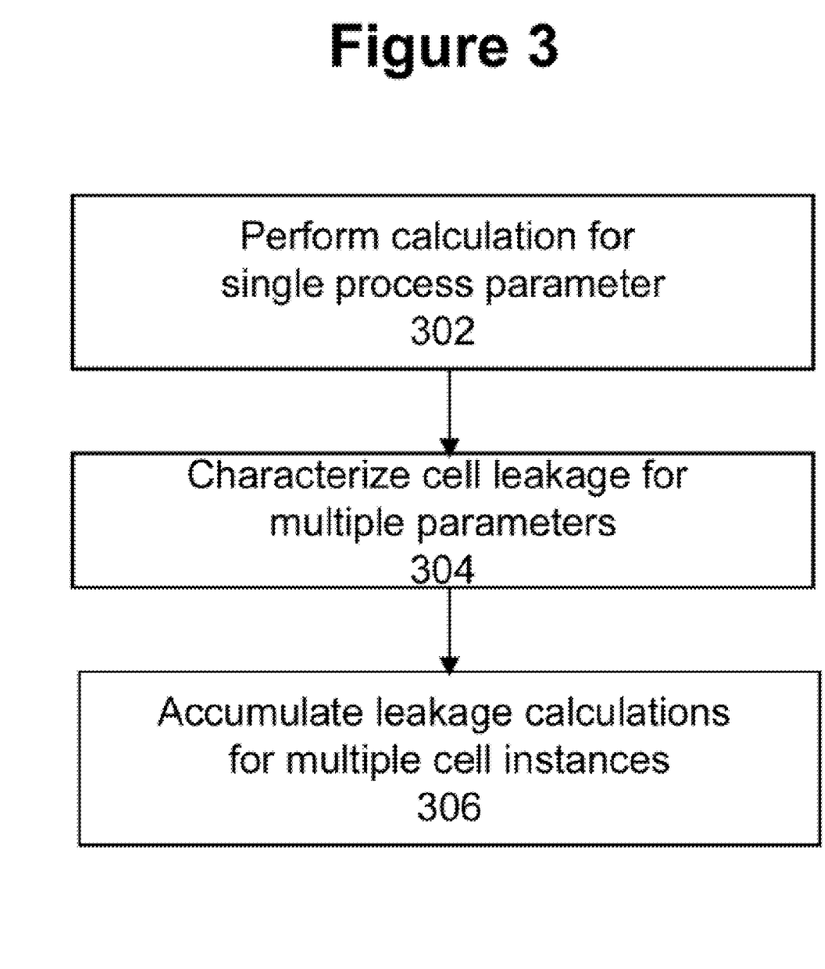
FIG. 3 illustrates a detailed flowchart of a process for analyzing/characterizing leakage power according to some embodiments of the invention.

FIG. 3 shows a flowchart of a process for performing leakage analysis for a larger portion of a circuit design, up to and including an entire circuit design. At 302, the above calculations are performed for single process parameters. Thereafter, at 304, cell characterization is performed for the multiple process parameters associated with the cell. The cell characterization data can then be stored into a library of such modeling information. At 306, leakage analysis is performed for a larger portion of the circuit design. This occurs by calculating and accumulating the leakage calculation for the multiple cell instances within the circuit portion under examination. Process actions 302 and 304 are described in more detail below.

According to some embodiments, for multiple process parameters in a cell, the parameter variations will be assumed to be independent from each other so that the total variation on the cell leakage power will be the summation of the variations from each individual parameter. One approach to implement the summation of the variations is using the following equation:

$$P = \Delta P + P_0 = \sum_{i=0}^{N} \Delta P^i + P_0 = \sum_{i=0}^{N} P^i - NP_0 \quad (5)$$

where $P^i$ is the leakage power of the cell when there is only one process parameter variation $\Delta X_i$ while all other parameters stay on their nominal values.

If the leakage power from individual parameters is expressed as a uni-exponential model using equation (1), a simple combining method can be used to sum up the exponential parts directly, e.g., using the following:

$$P = \sum_{i=0}^{N} P_0 e^{b_i \Delta X_i} - NP_0 \approx P_0 e^{\sum_{i=0}^{N} b_i \Delta X_i} \quad (6)$$

Such an approximation will be accurate when $b_i$ has very small absolute values. One issue is that if there are significant values in $b_i$, then equation (6) could generate significant errors.

The benefit of using equation (6) to combine the leakage power effect from different process parameter variations is that it keeps the dependency of the cell leakage power on the individual parameters. Since keeping such dependency usually results in a more accurate analysis, it is desired to improve the accuracy of the combining approximation while the format of equation (6) is maintained. According to some embodiments, the following equation can be used to combine the leakage power variations resulted from different process parameters:

$$P \approx wP' = wP_0 e^{\sum_{i=0}^{N} b'_i \Delta X_i} \quad (7)$$

By matching both sides in mean and covariance with each individual parameter variation as:

$$\langle P \rangle = w \langle P' \rangle \text{ and } \langle \Delta X_i P \rangle = w \langle \Delta X_i P' \rangle \quad (8)$$

the constants of w and $b'_i$ can be computed as:

$$b'_i = b_i \langle P^i \rangle / \langle P \rangle \text{ and } w = \langle P \rangle / \langle P' \rangle \quad (9)$$

The above combining method can be extended to the case where the bi-exponential model is used for individual parameters. If the total cell leakage power and the contribution from each individual parameter are partitioned into b part and c part as $P = P_b + P_c$ and $P^i = P_b^i + P_c^i$, then the b part and c part can be approximated separately using the above mean/covariance matching method to arrive at the total cell leakage power as follows:

$$P \approx 0.5P_0\left(w_b e^{\sum_{i=0}^{N} b'_i \Delta X_i} + w_c e^{\sum_{i=0}^{N} c'_i \Delta X_i}\right) \quad (10)$$

where the constants are computed similarly as equation (9) as $$w_b = \langle P_b \rangle / \langle P'_b \rangle, w_c = \langle P_c \rangle / \langle P'_c \rangle$$

$$b'_i = b_i \langle P_b^i \rangle / \langle P_b \rangle, c'_i = c_i \langle P_c^i \rangle / \langle P_c \rangle \quad (11)$$

Therefore, this approach can be used to provide characterization for each cell, by summing the leakage power for the process parameters associated with that cell. The cell modeling information can be stored in a database or library of cell models.

The leakage power of the circuit design will be the summation of the leakages from individual cell instances in the design (or of the portion of the design under examination). Since different instances belonging to the same cell may have different leakage power due to their different input states and each instance may have different probability to stay in different input states, one possible approach for the estimation of the leakage power for instance i is the weighted average of leakage powers in all possible states where the total leakage power of a circuit will be:

$$P = \sum_i P^i = \sum_i \sum_s p_s^i P_s^i \quad (12)$$

where $p_s^i$ is the probability for instance i to stay in state s and $P_s^i$ is the leakage power of the instance i in state s.

Specific embodiments will now be described with respect to: (1) summation of two exponential forms; (2) random variations in the library; and (3) random variations in the accumulation.

Some embodiments of the invention provide an approach for combining two or more exponential forms to represent the summation as a new exponential form. The summation of two exponential forms generally does not fit into a single exponential form. According to the a present embodiment, approximations are employed to add up two or more exponential forms and to represent the summation as a new exponential form as follows:

$$ae^X + be^Y \approx me^{pX+qY} \quad (13)$$

where $$(X,Y) \sim N(0,0,\sigma_X^2,\sigma_Y^2,\sigma_{XY}^2)$$

are two Gaussian random variables with covariance $\sigma_{XY}^2$, a and b are known constants, and m, p and q are the approximation constants.

The reason a linear combination form is used in the approximation is that it maintains the dependency of the summation on the individual random variables before summation. With this consideration, a natural approximation strategy is again to match both sides of equation (13) with mean and covariance as:

$$\langle ae^X + be^Y \rangle = \langle me^{pX+qY} \rangle$$

$$\langle aXe^X + bYe^Y \rangle = \langle mXe^{pX+qY} \rangle$$

$$\langle aYe^X + bYe^Y \rangle = \langle mYe^{pX+qY} \rangle \quad (14)$$

The approximation constants m and p can be solved as follows:

$$p = \frac{a}{a + be^{-0.5\sigma_{X-Y}^2}} \quad (15)$$

$$m = \frac{ae^{0.5\sigma_{X-Y}^2} + b}{e^{0.5p^2\sigma_{X-Y}^2}}$$

where $\sigma_{X-Y}^2 = \sigma_X^2 + \sigma_Y^2 - 2\sigma_{XY}^2$ is the covariance of random variable X-Y and the last approximation constant q=1-p.

If the bi-exponential model is used for both added leakage powers, then the b and c parts are added separately with the above mean/covariance matching method:

$$P_1 = a_1 e^{X_b} + b_1 e^{X_c}$$

$$P_2 = a_2 e^{Y_b} + b_2 e^{Y_c}$$

$$P_3 = P_a + P_2 \approx m_a e^{Z_b} + m_b e^{Z_c}$$

$$m_a e^{Z_b} \approx a_1 e^{X_b} + a_2 e^{Y_b}$$

$$m_b e^{Z_c} \approx b_1 e^{X_c} + b_2 e^{Y_c} \quad (16)$$

This document will now describe some embodiments specifically for random variations. To provide some background on variations generally, it is noted that there are numerous types of process variations that may result from the IC manufacturing process. The following are four possible categories for the process variations:

1. "Global" variations—This category of variations corresponds to die-to-die process variations. Here, it is assumed that the process variations are identical across the die. This is often used for fully correlated variations.
2. "Local" variations—This category corresponds to within-the-die process variations. Here, the process parameters are assumed to vary across the die with some correlation, which is typically defined in terms of distance between cell instances.
3. "Random" Variations—These variations, as is evident from the name, factor in the effect of random and uncorrelated variations in the various elements of the circuit.
4. "Environmental"—This category of process variations correspond to, for example, temperature and voltage variations.

Figure 4:
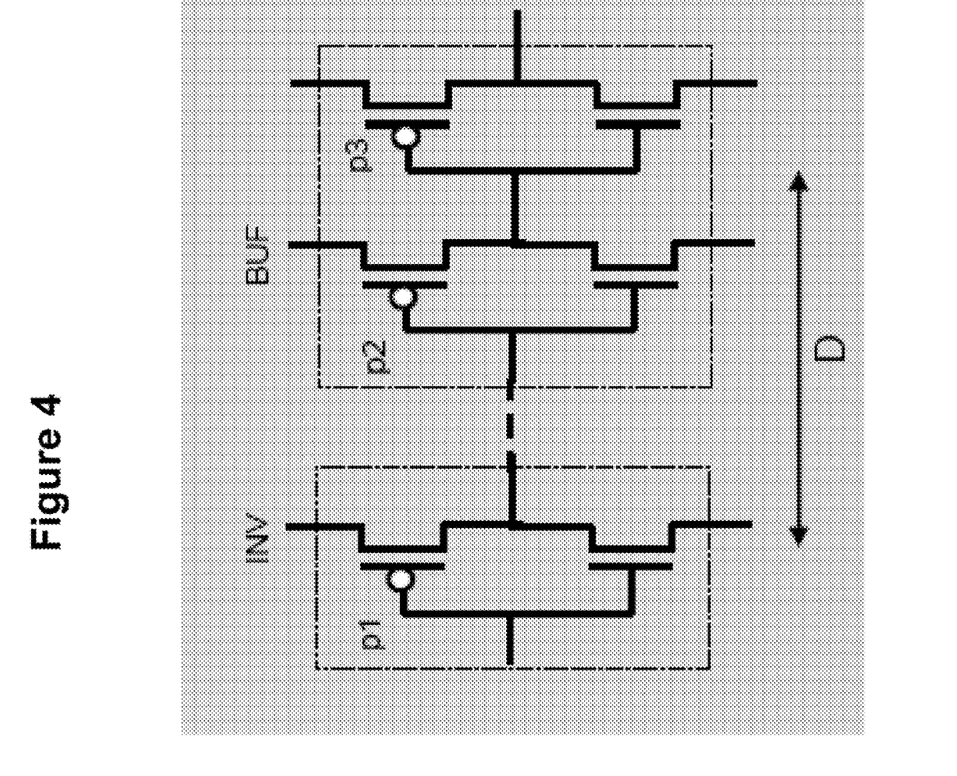
FIG. 4 is used to illustrate different categories of process variations.

FIG. 4 illustrates these different categories of variations and their possible correlation types, where it is assumed that the variation modeling is characterized by the following:

$$P = P_{nom} + P_{global} + P_{sys} + P_{random}$$

"P" refers to the process parameter random variable (e.g., Tox, Length, and Width). $P_{nom}$ is the nominal value. $P_{global}$ corresponds to off-chip global variations, with perfect correlation between devices: Correlation(p1,p2)=Correlation(p1, p3)=Correlation(p2,p3)=1. $P_{sys}$ corresponds to on-chip Systematic Variations, with correlation as a function of distance: Correlation(p2,p3) =1; Correlation(p1,p2)=Correlation(p1, p3)=f(D). $P_{random}$ corresponds to on-chip random variations, with no correlation between devices: Correlation(p1,p2)= Correlation(p1,p3)=Correlation(p2,p3)=0.

By their very nature the random variations are the hardest to compute. This is because there is a need to factor in the effect of the devices within the standard cell varying independently of each other. However, for within-die variations, it is quite possible that the state and characteristics of devices for a first state to be different from a second state. The differences between the multiple states could affect leakage, and as a result, should be considered when performing leakage power analysis/characterization. The issue is further complicated by process variations that occur to features within the design.

Random variations could vary independently from transistor to transistor. Therefore, the leakage power variation caused by these random variations could also vary independently as well. However, the leakage power of a cell may be a summation of leakage power for a group of transistors decided by the input state of the cell and different input states may have some transistors in common. The leakage power of different states of a cell may then have correlation caused just by sharing the common transistors which have random variations.

Figure 5:
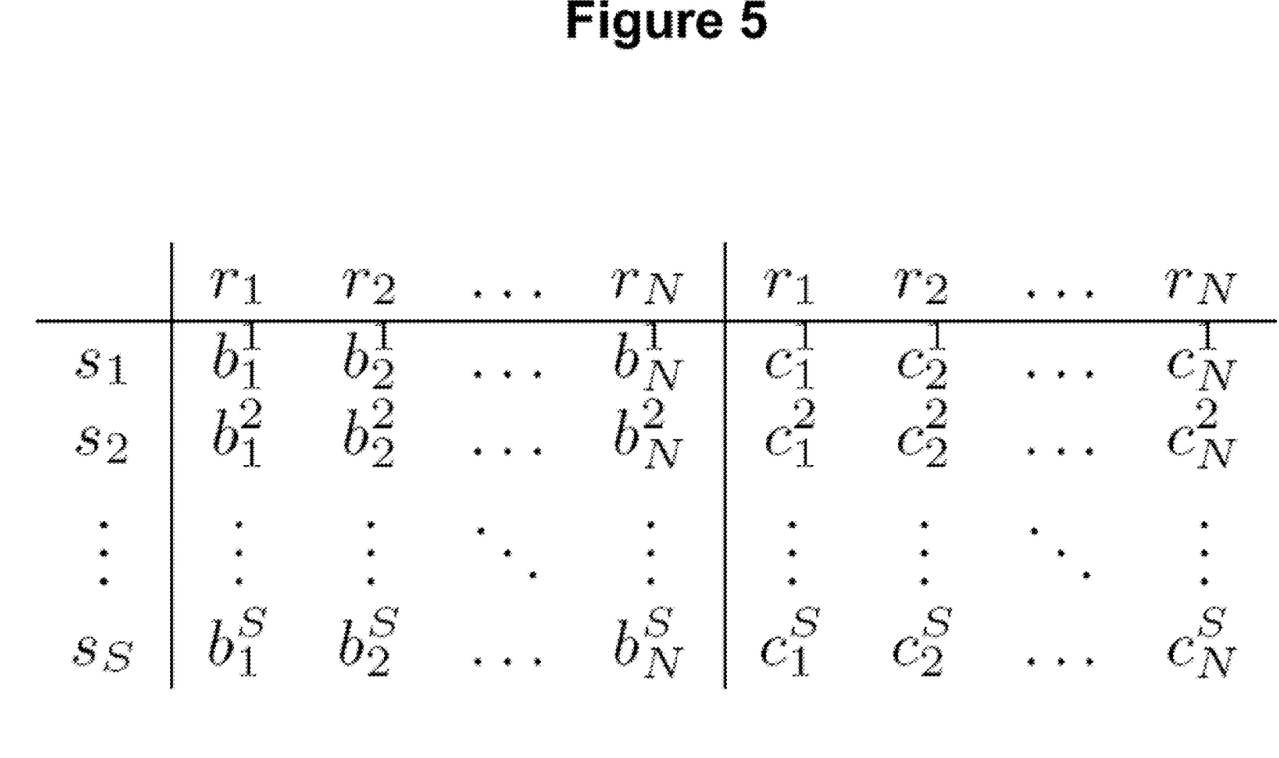
FIG. 5 illustrates random variations in terms of their exponential parts.

If there are R types of random variations for each transistor, then for a cell with T transistors and S states, there will be S leakage power expressions with format as equation (10) each of which may contain $2 \times R \times T = 2N$ random variation terms in their exponential parts, as shown in FIG. 5. In FIG. 5, $r_1$, $r_2, \ldots, r_N$ represent the random variations. Therefore, the total number of additional terms that should be recorded in the cell library would be $2 \times R \times T \times S$, which could be a vary large number. For example, for a 4-input nand gate, there could be 8 transistors and 16 states. Suppose there are 4 types of random variations for each transistor, then in total, there will be $2 \times 4 \times 8 \times 16 = 1024$ sensitivity values in the random part of the cell leakage power expression.

To reduce the size of the library, the number of values recorded in the library may be reduced, without losing accuracy. The random variations could be lumped into a single variation for each input state and a covariance matrix is generated to remember the correlation between the states caused by sharing random variations.

Three matrices BB, RC, and CC are involved in the correlations among the 2S sensitivity forms. The elements of these matrices are computed as follows:

$$BB[i][j] = \sum_k b_k^i b_k^j,$$ (17)

$$BC[i][j] = \sum_k b_k^i c_k^j,$$

$$CC[i][j] = \sum_k c_k^i c_k^j$$

where k is the index of all random variations in the cell, i and j are the index of states. All of these three matrices have size $S \times S$, but in some embodiments, the symmetry of matrix BB and CC causes only the lower triangle parts of them to be recorded in the library. As such, the total number of values recorded in the library will be $2S^2 + S$. With example of a 4-input nand gate as discussed above, the number of recorded values are 528 which is roughly half of the original number of 1024.

During accumulation of the leakage power from the multiple instances, the sensitivities on the random variations will be recovered from the covariance matrices recorded in the library using a statistical method of principle component analysis (PCA). If there are significant correlations among the different input states of the cell, the number of random variation terms in each sensitivity form may be smaller than the number of random variations in the cell. However, even with this reduction, the number of random variation terms could quickly increase to an unacceptable level since the number of instances in the circuit may be very large.

Therefore, some embodiments provide a lumping mechanism during leakage power accumulation. According to this approach, the total leakage power for an instance will first be computed as shown in equation (12) and then these instance leakage powers are added up to compute the total leakage power for a circuit. This type of ordering is advantageous since the random variations will be independent among instances so there is a possibility to lump those random sensitivities into a single random term.

Using a bi-exponential model complicates this analysis. When using the instance leakage power bi-exponential expression, there will be correlation between the b and c parts caused by sharing the same random variations. Such correlation information will be lost if all random terms are lumped together.

A "lost covariance" value is used to remember the lost correlation between b and c parts during the lumping operation. The lost covariance for an instance is initially 0 and it will be added by the covariance between the b and c random parts when the instance undergoes a lumping operation. However, when two leakage power expressions $P_1$ and $P_2$ are added together using equation (16), the lost covariance of the resulted leakage power $P_3$ will be:

$$L_3 = p_b p_c L_1 + (1-p_b)(1-p_c) L_2$$ (18)

where $L_1$, $L_2$ and $L_3$ are the lost covariance of $P_1$, $P_2$ and $P_3$ respectively, $P_b$ and $P_c$ are the constants used to combine the b and c parts of $P_1$ and $P_2$, i.e. $Z_b = p_b X_b + (1-p_b) Y_b$ and $Z_c = p_c X_c + (1-p_c) Y_c$.

System Architecture Overview

Figure 6:
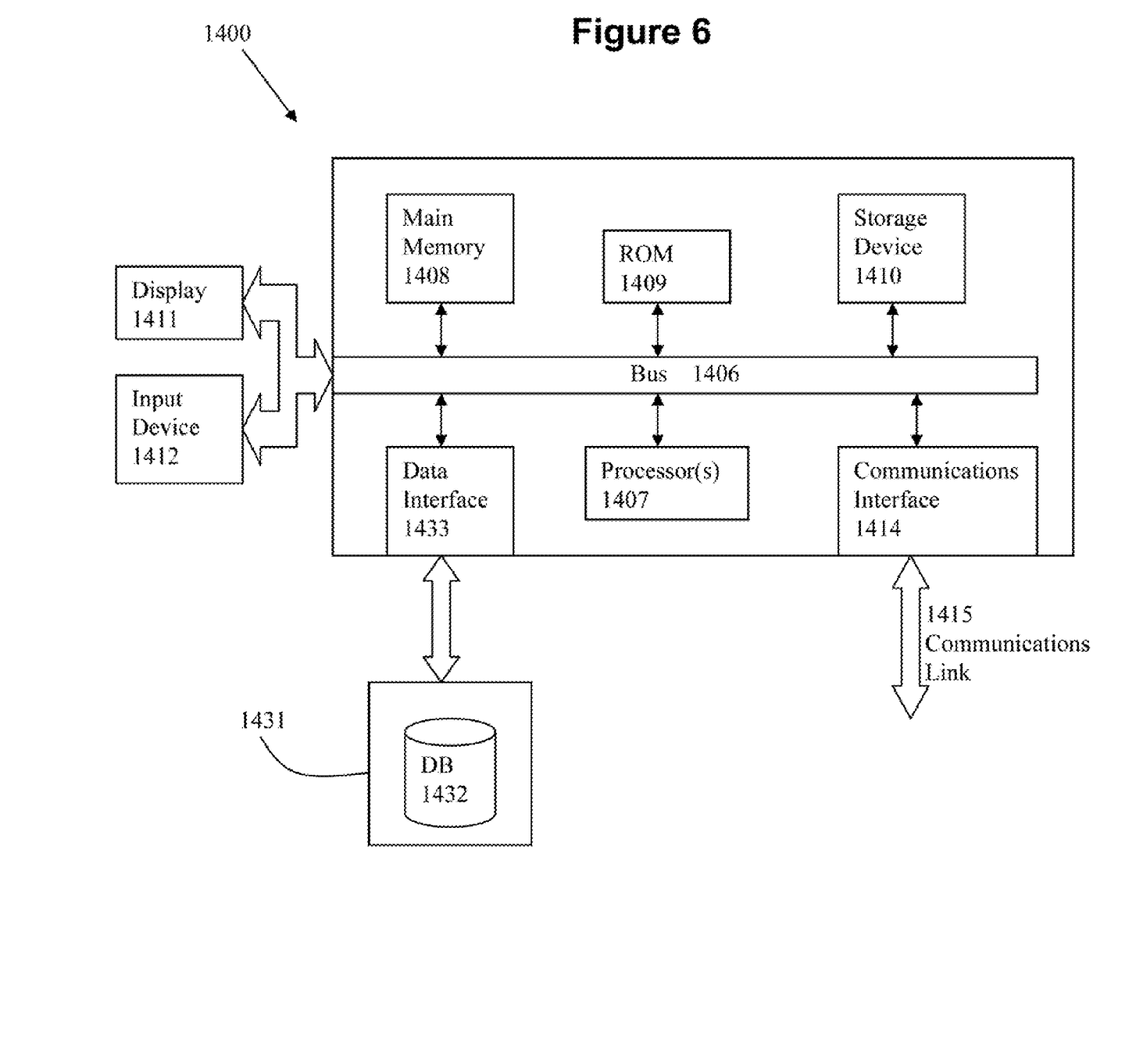
FIG. 6 shows an architecture of an example computing system with which the invention may be implemented.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for performing leakage power analysis on an electronic design, comprising:
    using at least one processor for performing one or more actions, the one or more actions comprising:
    identifying an electronic design that is to undergo analysis;
    modeling a nonlinear behavior of leakage power by using a bi-exponential modeling for the leakage power that comprises a non-linear model with two exponential terms for one or more variations; and
    performing leakage power analysis upon the electronic design, wherein
        the leakage power analysis is performed based at least in part upon the bi-exponential modeling to analyze the nonlinear behavior.

2. The computer implemented method of claim 1 in which the bi-exponential modeling is used to represent leakage power dependency upon a process parameter for a manufacturing process.

3. The computer implemented method of claim 2, in which the analysis results for individual process parameters are combined to analyze the electronic design for multiple process parameters.

4. The computer implemented method of claim 3, in which the analysis results for the individual process parameters are combined by summing variations from the analysis results for the individual process parameters.

5. The computer implemented method of claim 2, in which a cell characterization is performed by combining leakage power for the multiple process parameters associated with a cell.

6. The computer implemented method of claim 5, in which the leakage power analysis for the electronic design is calculated by combining leakage power for multiple cells.

7. The computer implemented method of claim 2, in which the process parameter comprises a channel length, a channel width, an oxide thickness, or a threshold voltage.

8. The computer implemented method of claim 1, in which sensitivity for a process variation is considered to perform the bi-exponential modeling.

9. The computer implemented method of claim 1, in which the following form is used to represent the bi-exponential modeling:

$$P = 0.5 P_0 [\exp(b \cdot \Delta X) + \exp(c \cdot \Delta X)]$$

where P represents leakage power, Po represents nominal leakage power, $\Delta X$ represents a process variation, and b and c are two sensitivity constants.

10. The computer implemented method of claim 9, in which the sensitivity constants b and c are computed using the following:

$$b, c = \frac{1}{3} \log\left(0.5u \pm 0.5\sqrt{u^2 - 4v}\right)$$

where $u = 2P^+/P_0$ and $v = P^{30}/P^{31}$, and P+ and P− denote two leakage power values measured when $\Delta X$ is of a predetermined value.

11. The computer implemented method of claim 1, in which a random variation is considered by considering cell states for the leakage power analysis.

12. The computer implemented method of claim 1, in which one or more matrices of variation and state values are used to perform the leakage power analysis.

13. The computer implemented method of claim 12, in which a lumping mechanism is employed while performing leakage power accumulation for the leakage power analysis.

14. The computer implemented method of claim 13, in which a lost covariance value is used to retain a correlation for the leakage power analysis.

15. The computer implemented method of claim 1, the one or more actions further comprising:
    maintaining dependency of the leakage power on each of a plurality of process parameters.

16. The computer implemented method of claim 15, the one or more actions further comprising:
    partitioning the leakage power into two or more parts;
    partitioning a contribution to the leakage power from each process parameter of the plurality of parameters; and
    determining the leakage power by using at least a mean and covariance matching process.

17. A computer program product that includes a non-transitory computer readable medium, the non-transitory computer readable medium comprising a plurality of computer instructions which, when executed by a processor, cause the processor to execute a process for performing leakage power analysis on an electronic design, the process comprising:
    identifying an electronic design that is to undergo analysis;
    modeling a nonlinear behavior of leakage power by using a bi-exponential modeling for the leakage power that comprises a non-linear model with two exponential terms for one or more variations; and
    performing leakage power analysis upon the electronic design, wherein
        the leakage power analysis is performed based at least in part upon the bi-exponential modeling to analyze the nonlinear behavior of the leakage power.

18. The computer program product of claim 17, the process further comprising:
    maintaining dependency of the leakage power on each of a plurality of process parameters.

19. The computer program product of claim 18, the process further comprising:
    partitioning the leakage power into two or more parts;
    partitioning a contribution to the leakage power from each process parameter of the plurality of parameters; and
    determining the leakage power by using at least a mean and covariance matching process.

20. A system for performing leakage power analysis on an electronic design, comprising:
- at least one processor for executing a sequence of computing instructions; and
- a memory for holding the computing instructions and for storing results of executing the computing instructions, in which the computing instructions comprise instructions for at least:
- modeling a nonlinear behavior of leakage power by using a bi-exponential modeling for the leakage power that comprises a non-linear model with two exponential terms for one or more variations; and
- identifying an electronic design that is to undergo analysis and performing leakage power analysis upon the electronic design, wherein the leakage power analysis is performed based at least in part upon the bi-exponential modelinganalyze the nonlinear behavior.

21. The system of claim 20, the computing instructions further comprise the instructions for at least:
- maintaining dependency of the leakage power on each of a plurality of process parameters.

22. The system of claim 21, the computing instructions further comprise the instructions for at least:
- partitioning the leakage power into two or more parts;
- partitioning a contribution to the leakage power from each process parameter of the plurality of parameters; and
- determining the leakage power by using at least a mean and covariance matching process.

* * * * *